United States Patent
Baba et al.

(10) Patent No.: US 9,215,829 B2
(45) Date of Patent: Dec. 15, 2015

(54) ELECTRONIC DEVICE

(75) Inventors: Junji Baba, Hadano (JP); Masaaki Inoue, Hadano (JP); Shuuji Kameno, Hadano (JP); Toru Sasaki, Yokohama (JP)

(73) Assignee: Alaxala Networks Corporation, Kanagawa (JP)

(*) Notice: Subject to any disclaimer, the term of this patent is extended or adjusted under 35 U.S.C. 154(b) by 310 days.

(21) Appl. No.: 13/885,620

(22) PCT Filed: Oct. 26, 2011

(86) PCT No.: PCT/JP2011/005960
§ 371 (c)(1),
(2), (4) Date: May 15, 2013

(87) PCT Pub. No.: WO2012/066732
PCT Pub. Date: May 24, 2012

(65) Prior Publication Data
US 2013/0235524 A1  Sep. 12, 2013

(30) Foreign Application Priority Data
Nov. 17, 2010 (JP) ................. 2010-256386

(51) Int. Cl.
*H05K 7/20* (2006.01)
*H05K 7/14* (2006.01)
*H01L 23/473* (2006.01)

(52) U.S. Cl.
CPC .......... *H05K 7/20136* (2013.01); *H05K 7/1452* (2013.01); *H05K 7/1457* (2013.01); *H05K 7/20727* (2013.01)

(58) Field of Classification Search
CPC ... G06F 1/81–1/182; H05K 7/20218–7/20381; H05K 7/20409–7/20418; H05K 7/20009–7/202; H01L 23/367–23/3677; H01L 23/473; H01L 23/46–23/467
USPC .............. 361/676–678, 679.46–679.54, 361/688–723, 780, 788, 794; 165/80.1–80.5, 104.33, 185; 174/15.1–15.3, 16.1–16.3, 547, 548; 454/185; 312/236
See application file for complete search history.

(56) References Cited

U.S. PATENT DOCUMENTS

| | | | | |
|---|---|---|---|---|
| 6,072,159 A | * | 6/2000 | Wilkie, II | H02B 1/32 219/403 |
| 6,525,935 B2 | * | 2/2003 | Casebolt | G06F 1/181 312/236 |

(Continued)

FOREIGN PATENT DOCUMENTS

| | | |
|---|---|---|
| JP | 04-157798 A | 5/1992 |
| JP | 06-162827 A | 6/1994 |

(Continued)

OTHER PUBLICATIONS

Japanese Office Action, Japanese Patent Appln. No. 2013-142237, Mar. 4, 2014, 2 pp.

(Continued)

*Primary Examiner* — Anthony Haughton
*Assistant Examiner* — Razmeen Gafur
(74) *Attorney, Agent, or Firm* — Volpe and Koenig, P.C.

(57) ABSTRACT

In an electronic device, when a 48 V feed system is shifted to a 12 V feed system, in order to supply the same electric power, a current of fourth times needs to flow into a backplane. Also, in an anteroposterior intake and exhaust system, there is a need to form a ventilator through which a cooling air passes in the backplane. Further, there arises a problem that a mechanical strength is deteriorated by provision of the ventilator in the backplane. There is provided a structure in which a pinnate projection is provided on a feed bus bar, and a cooling air is applied to the feed bus bar. Also, the feed bus bar is brought into close contact with an overall surface of the backplane, and electrically and mechanically connected thereto at multiple points, to thereby perform both of cooling and the suppression of stiffness deterioration.

13 Claims, 6 Drawing Sheets

(56) References Cited

U.S. PATENT DOCUMENTS

| | | | | |
|---|---|---|---|---|
| 7,079,386 B1* | 7/2006 | Jochym | G06F 1/183 | 361/679.47 |
| 7,394,654 B2* | 7/2008 | Zieman | G06F 1/20 | 312/236 |
| 7,719,834 B2* | 5/2010 | Miyamoto | G06F 1/187 | 312/223.2 |
| 7,722,359 B1 | 5/2010 | Frangioso, Jr. et al. | | |
| 7,755,889 B2* | 7/2010 | Vinson | G06F 1/20 | 312/223.2 |
| 7,804,684 B1* | 9/2010 | Aybay | H05K 7/1445 | 312/236 |
| 7,885,066 B2* | 2/2011 | Boyden | H05K 7/20563 | 312/236 |
| 8,064,200 B1* | 11/2011 | West | H05K 7/20563 | 361/694 |
| 8,120,912 B2* | 2/2012 | Aybay | H05K 7/20563 | 361/694 |
| 8,988,879 B2* | 3/2015 | Hamburgen | H05K 7/2079 | 165/104.22 |
| 2003/0117045 A1* | 6/2003 | Byron | H01H 31/12 | 312/199 |
| 2003/0214781 A1 | 11/2003 | Kolb et al. | | |
| 2003/0223196 A1* | 12/2003 | Smith | G06F 1/181 | 361/679.48 |
| 2004/0100765 A1* | 5/2004 | Crippen | G06F 1/20 | 361/679.48 |
| 2004/0130868 A1* | 7/2004 | Schwartz | G06F 1/20 | 361/679.48 |
| 2006/0044753 A1* | 3/2006 | Wong | H05K 7/20909 | 361/679.46 |
| 2006/0087814 A1* | 4/2006 | Brandon | H05K 7/20563 | 361/694 |
| 2007/0074866 A1* | 4/2007 | Bhatti | H05K 7/20736 | 165/248 |
| 2007/0207720 A1* | 9/2007 | Henry | H05K 7/20736 | 454/184 |
| 2007/0274043 A1* | 11/2007 | Shabany | H05K 7/20781 | 361/696 |
| 2008/0212273 A1* | 9/2008 | Bechtolsheim | H05K 7/1487 | 361/679.33 |
| 2008/0316704 A1* | 12/2008 | Vinson | G06F 1/20 | 361/695 |
| 2009/0059522 A1* | 3/2009 | Katakura | H05K 7/20736 | 361/695 |
| 2009/0061755 A1* | 3/2009 | Calder | H05K 7/20736 | 454/184 |
| 2009/0135558 A1* | 5/2009 | Hughes | H05K 7/20727 | 361/679.46 |
| 2009/0310300 A1* | 12/2009 | Chrysler | H05K 7/20681 | 361/691 |

FOREIGN PATENT DOCUMENTS

| | | |
|---|---|---|
| JP | 07-105676 A | 4/1995 |
| JP | 08-106776 A | 4/1996 |
| JP | 08-138775 A | 5/1996 |
| JP | 09-146895 A | 6/1997 |
| JP | 2008-166531 A | 7/2008 |
| JP | 2010-153738 A | 7/2010 |
| JP | 2010-251620 A | 11/2010 |

OTHER PUBLICATIONS

Korean Office Action, Korean Patent Appln. No. 10-2013-7009617, Feb. 7, 2014, 3 pp.

* cited by examiner

ELECTRONIC DEVICE

This application is the U.S. national phase application under 35 U.S.C. 371 of PCT application No. PCT/JP2011/005960 filed Oct. 26, 2011 and claims the benefit of priority from Japanese patent application No. 2010-256386 filed Nov. 17, 2010, the contents of which are hereby incorporated by reference as if fully set forth herein.

TECHNICAL FIELD

The present invention relates to an electronic device represented by LAN switches, routers, and servers, and more particularly to a backplane structure of the electronic device.

BACKGROUND ART

In general, a network communication device such as the LAN switches or the routers includes a circuit board unit having an interface function for packet transfer, a circuit board unit having a function of switching a packet to a desired port, and a circuit board unit having a function of controlling the packet transfer. Those circuit board units are connected to a relay circuit board (so-called backplane) arranged within the device through a connector, and signal transfer and power feeding between the circuit board units are executed through the backplane.

As a power supply of the network communication device, AC 100V or AC 200V is frequently applied in AC devices, and DC 48 V is frequently applied in DC devices. In general, the voltage is input to a front power unit of the device, the front power unit outputs DC 48 V, and the DC 48 V output is supplied to the respective circuit board units through the backplane.

On the other hand, an information processing device represented by the servers is also unitized into circuit board units for each function, as with the LAN switches and the routers. Those circuit board units are connected to the backplane arranged within the device through the connector, and the signal transfer and the power feeding between the circuit board units are executed through the backplane.

The power supply of the server is frequently AC 100V or AC 200V. In general, this voltage is input to the front power unit of the device, the front power unit outputs DC 12 V, and the DC 12 V output is applied to the respective circuit board units through the backplane.

Also, as a cooling structure of the network communication device and the information processing device, a cooling structure of an anteroposterior intake and exhaust system complying with an NEBS (network equipment building system) which is a standard of communication devices for communication carriers has been increasingly demanded.

In PTL 1, with higher function and multiple functions of electronic devices such as the servers, the number of electronic components to be mounted is exponentially increased, resulting in an increase in a current necessary for operating the electronic devices. Simultaneously, the electronic devices have been increasingly downsized and reduced in weight, and a demand for the reduction in the size and weight of the electronic components has also been increased. Accordingly, it is desirable to provide a feed bus bar structure that enables a large current to flow therein with a small size. However, there arises such a problem that the feed bus bar is heated by allowing the large current to flow therein.

In order to solve the above problem, The above PTL 1 employs a structure in which power supplies and loads are connected to each other one-on-one with the use of a bar-shaped feed bus bar, and a cooling fin is disposed in the feed bus bar to forcedly cool the feed bus bar.

Also, in PTL 2, when a large current is supplied to a circuit board unit within an electronic device, in power feeding using a usual connector, there is a need to increase the number of power supply connector pins, or decrease the number of signal connector pins to shift to the power supply purpose.

In order to solve the above problem, the above PTL 2 employs a connector structure in which a bar-shaped feed bar having a plurality of conductive layers and insulating layers like a multilayer circuit board is fixed to a gap between connectors of the backplane by a conductive pin contact and a conductive spacer, and the conductive pin contact and the circuit board unit are electrically connected to each other to supply the large current.

Further, in recent years, apart from the problems to be solved by the above PTL 1 and PTL 2, a new problem described below is actualized in the backplane structure of the electronic device.

As a first background, in a main system of the power feeding in the network communication device, DC 48 V is applied to the respective circuit board units through the backplane. However, in recent years, a shift from the 48 V feed system to a 12 V feed system is advanced. This is mainly because the 48 V feed system is large in configuration, needs to use an expensive insulating DC/DC converter, and is disadvantageous in power efficiency of the feed system and the installation area within the circuit board unit. On the other hand, in order to supply the same electric power as that of the 48 V feed system, the 12 V feed system needs to allow a current of four times to flow.

As a second background, in recent years, as the cooling structure of the network communication device and the information processing device, the cooling structure of the anteroposterior intake and exhaust system complying with the NEBS (network equipment building system) which is the standard of the communication devices for the communication carriers has been increasingly demanded. As the network communication device of the anteroposterior intake and exhaust system, configurations illustrated in FIGS. 1(a) to 4(a) are proposed. In order to realize the anteroposterior intake and exhaust system, there is a need to form a ventilator through which a cooling air passes in the backplane.

CITATION LIST

Patent Literature

PTL 1: JP-A-6-162827
PTL 2: JP-A-8-138775

SUMMARY OF INVENTION

Technical Problem

As described above, the large current needs to flow in the backplane, and the ventilator needs to be formed, thereby narrowing a current path, resulting in a problem of power loss and heat generation in a feed path. Further, with the formation of the ventilator in the backplane, a stiffness of the backplane per se becomes sacrificial, resulting in a problem that a mechanical strength becomes remarkably deteriorated.

The present invention has been made to solve the above-mentioned new problem, and aims at providing a backplane structure that can suppress the electric power loss and the heat generation in the feed path even with the application of the anteroposterior intake and exhaust system, and enforces the mechanical strength and further suppresses the costs in an electronic device.

Solution to Problem

In order to solve the above problem, the present invention can solve at least a part of the above-mentioned problems with the following configurations and applied examples.

There is provided an electronic device including: a circuit board unit; a backplane that connects the circuit board to a front surface thereof; a feed bus bar that is connected to a back surface of the backplane; and a power unit that is connected to the feed bus bar, in which a ventilator is formed in the backplane and the feed bus bar, and a radiation projection is further formed on the bus bar.

Advantageous Effects of Invention

One surface of the planar feed bus bar is planar, brought in close contact with an overall surface of the backplane, and electrically and mechanically connected thereto at multiple points, and the other surface of the planar feed bus bar is provided with a pinnate projection. With this configuration, the electric power loss and the heat generation of the backplane can be suppressed, the mechanical strength can be reinforced, and the ventilator of the backplane can be widely ensured. Also, the numbers of power supply layers and ground layers of the circuit board configuring the backplane can be reduced, and the costs can be suppressed.

DESCRIPTION OF EMBODIMENTS

Hereinafter, modes for carrying out the present invention will be described in detail on the basis of four embodiments.

Figure 1A:
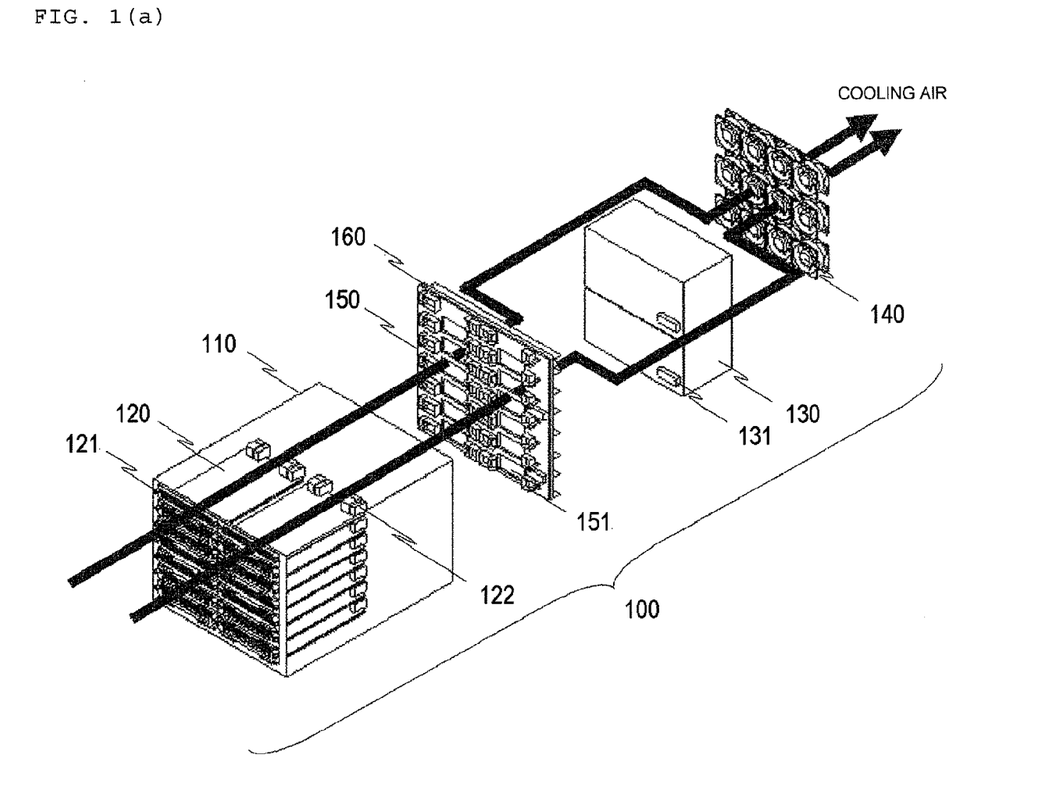
FIG. 1(a) illustrates an example of a configuration of an electronic device according to a first embodiment.
Figure 2A:
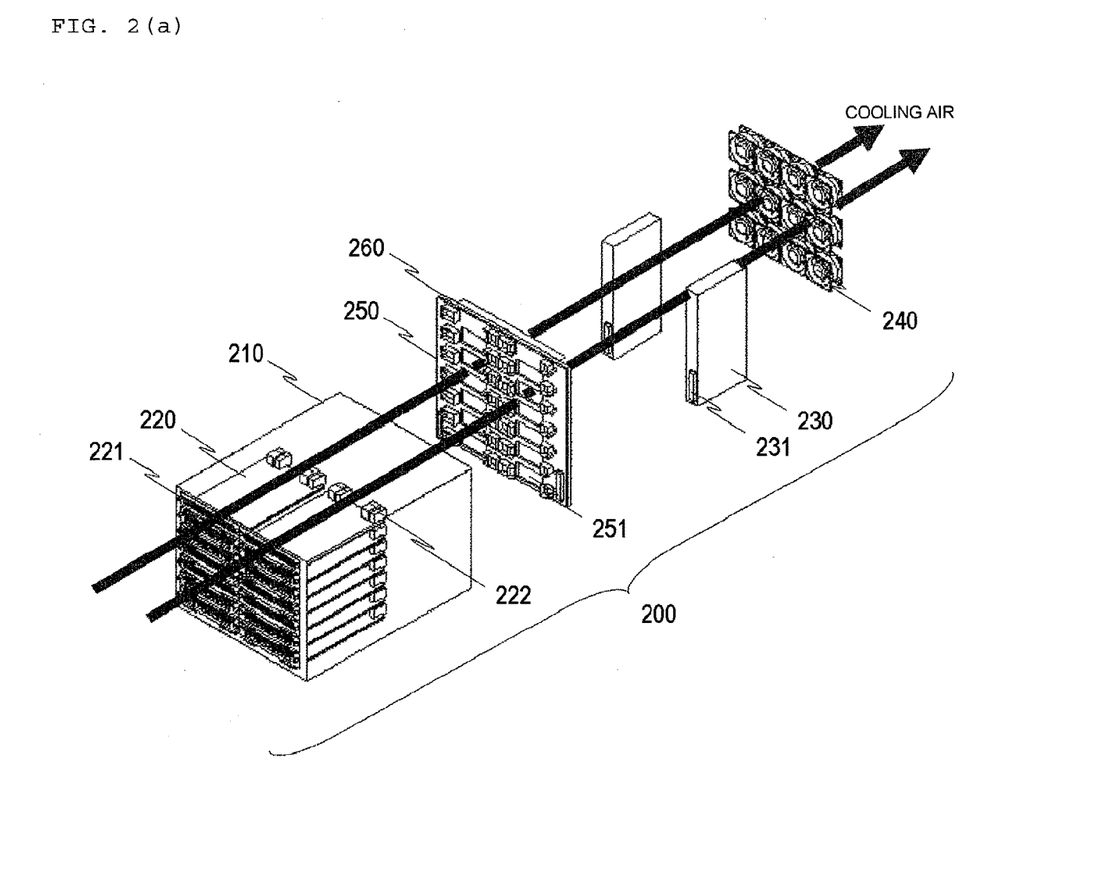
FIG. 2(a) illustrates an example of a configuration of an electronic device according to a second embodiment.
Figure 3A:
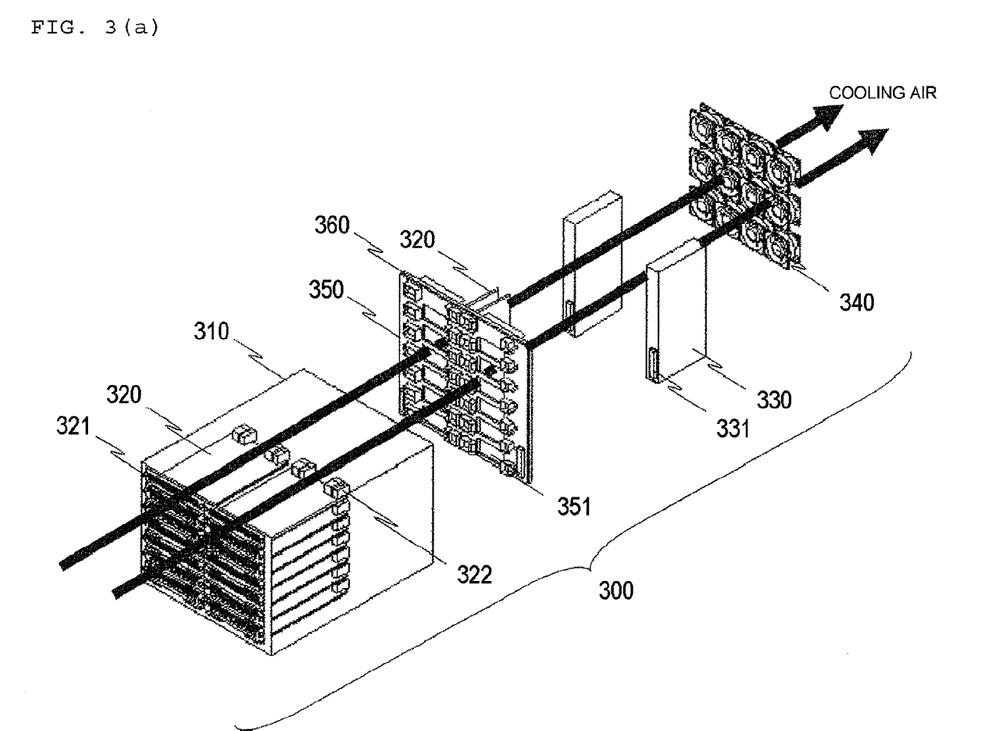
FIG. 3(a) illustrates an example of a configuration of an electronic device according to a third embodiment.
Figure 4A:
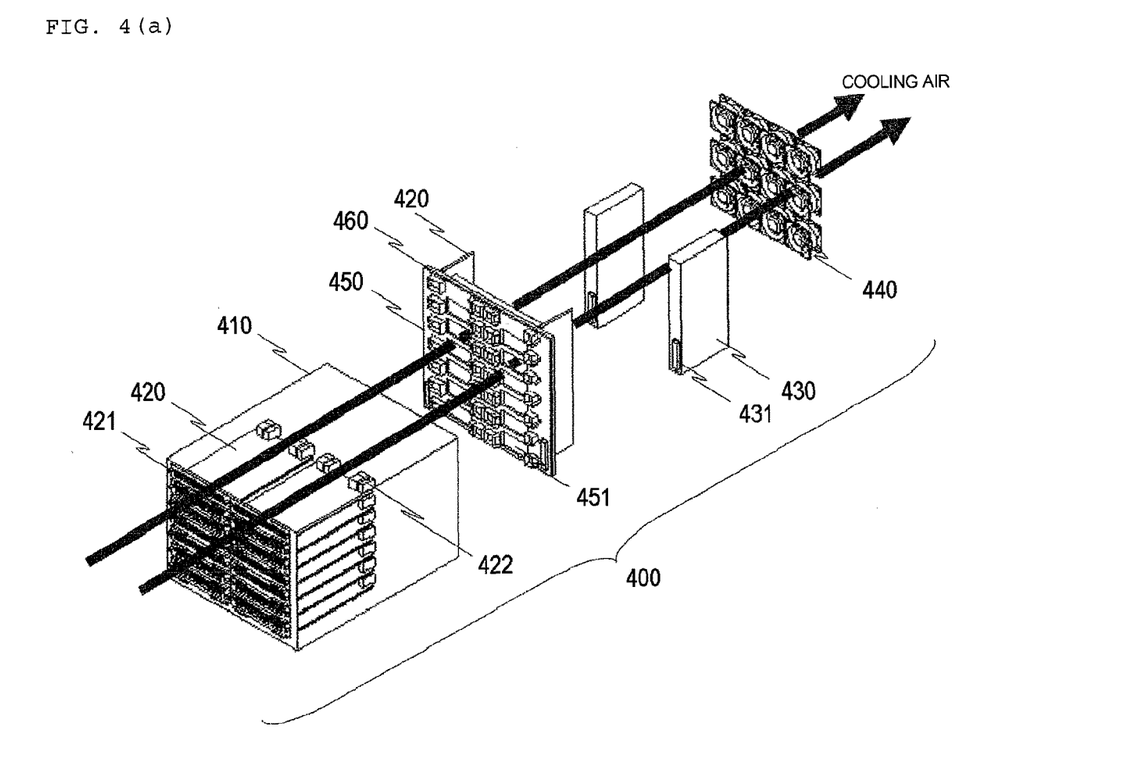
FIG. 4(a) illustrates an example of a configuration of an electronic device according to a fourth embodiment.

FIG. 1(a) is a diagram schematically illustrating a configuration of an electronic device 100 according to a first embodiment of the present invention. FIG. 2(a) is a diagram schematically illustrating a configuration of an electronic device 200 according to a second embodiment of the present invention. FIG. 3(a) is a diagram schematically illustrating a configuration of an electronic device 300 according to a third embodiment of the present invention. FIG. 4(a) is a diagram schematically illustrating a configuration of an electronic device 400 according to a fourth embodiment of the present invention. The electronic devices 100 to 400 each function as a network communication device that conducts packet transfer in a computer network.

First Embodiment

FIG. 1(a) illustrates a front side perspective view of the electronic device 100. The electronic device 100 includes a plurality of circuit board units 120, a plurality of front power units 130, a plurality of cooling units 140, a backplane 150, and a feed bus bar 160 within a housing 110.

The electronic device 100 of this embodiment has the plurality of circuit board units 120, and those units are implemented in a parallel state from a front surface of the device. The circuit board units 120 are each configured by a circuit board on which a semiconductor element is mounted, and realize a variety of functions for conducting packet transfer. For example, the circuit board units 120 include a circuit board unit that conducts an interface control with an external, a destination retrieval of a packet, and transfer processing of the packet, a circuit board unit that switches the packet to a desired port, and a circuit board unit that conducts a basic control of the electronic device 100.

Those circuit board units 120 each have a ventilator 121 through which a cooling air passes on a front surface side of the device. Also, the respective circuit board units 120 each have a backplane connector 122 on a side opposite to the front surface side of the device. The respective backplane connectors 122 are connected to the backplane 150 to execute signal transfer and power feeding between the respective circuit board units. The number of mounted circuit board units 120 is not limited to the number of mounted circuit board units illustrated in this figure.

In order to enhance the reliability of the device, the electronic device 100 according to this embodiment includes the plurality of front power units 130 to realize redundancy. Those front power units 130 are implemented in a horizontal state from a rear surface of the device. There are many cases in which as a power supply of the network communication device, the front power units 130 are applied with AC 100 V or AC 200 V in an AC device, and DC 48 V in a DC device, and AC/DC conversion processing to DC/DC conversion processing are conducted to output DC 48 V.

It is general that outputs of the front power units 130 are connected to the backplane 150 by power connectors 131, and DC 48 V is applied to the respective circuit board units through the backplane. However, in a system where DC 48 V is applied to the respective circuit board units 120, there is a need to use an insulating DC/DC converter which is large in the configuration and expensive, within the circuit board units 120. Also, the system is disadvantageous in the power efficiency of a power feeding system, and the installation area within the circuit board unit. As a result, an output voltage of the front power units 130 is mainly going to be DC 12 V. The number of mounted front power units 130 is not limited to the number of mounted front power units illustrated in this figure.

In the electronic device 100 according to this embodiment, the circuit board units 120 are implemented in a parallel state from the front surface of the device, and a flow of cooling air to a semiconductor element employs an anteroposterior intake and exhaust structure. The cooling units 140 configured by a fan for allowing the cooling air to forcedly flow are installed on a rear surface side of the housing 110. The number of mounted cooling units 140 is not limited to the number of mounted cooling units illustrated in this figure. Also, the number of interfaces on the front surface is suppressed, but may be arranged on the front surface of the housing 110. This is also applied to the other embodiments.

The circuit board units 120 and the front power units 130 are connected to the backplane 150 arranged within the device through a connector. The backplane 150 is normally configured by a multilayer circuit board, and mainly has two functions. A first function is to connect the plurality of circuit board units 120 to each other by wirings to transfer a signal. A second function is to feed DC 48 V to DC 12 V developed by the front power units 130 to the respective circuit board units 120.

In particular, in the network communication device, when a demand for an improvement in a processing performance is increased, the power consumption of the respective circuit board units 120 is going to increase, and a shift from the 48 V feed system to the 12 V feed system is advanced as described above. Therefore, the amount of current flowing in the backplane 150 is going to increase. For example, as compared with the 48 V feed system, the 12 V feed system needs the amount of current of four times in order to apply the same electric power, and power loss in a feed path is 16 times. For that reason, the feed paths placed on the backplane 150, that is, the numbers of power layers and ground layers need to increase, resulting in an increase in the costs of the backplane 150.

Further, the electronic device 100 according to this embodiment employs the cooling structure of the anteroposterior intake and exhaust system, and needs to provide ventilators 151 through which the cooling air passes in the backplane 150. This leads to a problem that even if the numbers of power supply layers for feeding and ground layers are increased, sufficient current paths are not obtained. For that reason, the feed bus bar 160 to be described later is laid.

Figure 1B:
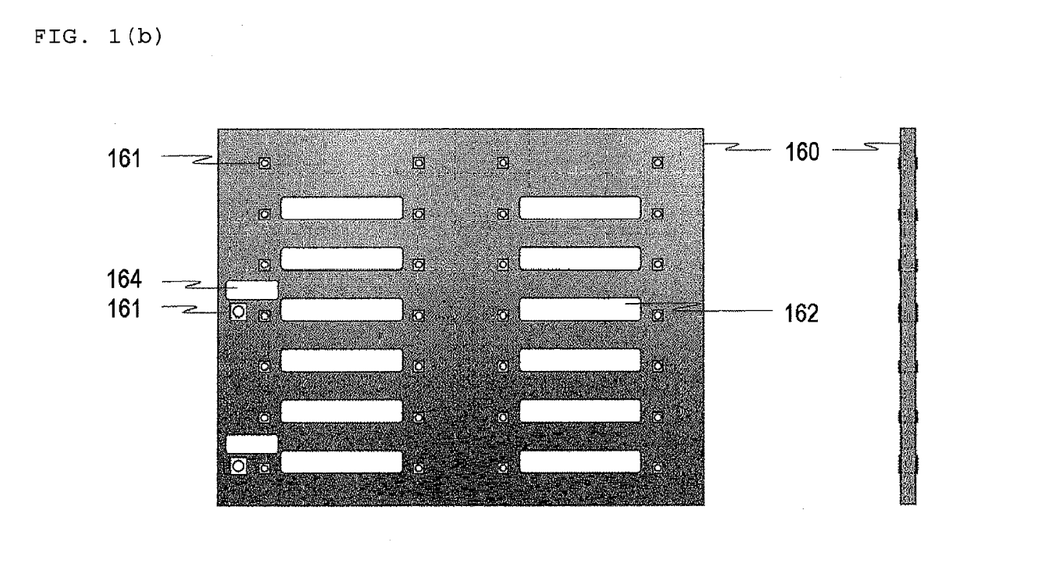
FIG. 1(b) illustrates an example of a feed bus bar in the first embodiment.
Figure 1C:
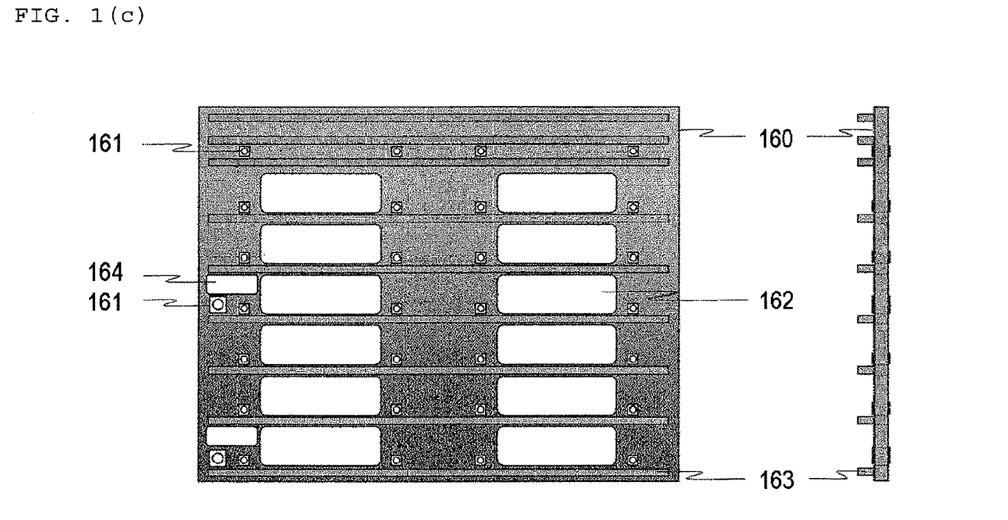
FIG. 1(c) illustrates an example of the feed bus bar in the first embodiment.

FIGS. 1(b) and 1(c) illustrate the feed bus bar 160. The feed bus bar 160 is made of metal such as copper or aluminum, and electrically and mechanically connected to the power layers or the ground layers of the backplane 150 with the use of feed terminals 161 by screwing or soldering. In this embodiment, the plurality of circuit board units 120 and the plurality of front power units 130 are connected to each other at multiple points by the plurality of feed terminals 161.

In general, the power feeding to the circuit board units 120 is frequently executed by the power layers and the ground layers laid on the backplane 150 configured by a multilayer circuit boards. However, when the amount of current to be supplied is large, even if the numbers of power layers and ground layers are increased, a power loss cannot be ignored, and an increase in the costs is induced. As a result, the feed bus bar 160 is frequently laid to feed a power. However, even if the feed bus bar 160 is laid to reduce the electric power loss, the heat generation remains as the problem.

As a countermeasure against that problem, it is conceivable that a volume of the feed bus bar 160 is increased to reduce an electric resistance value. However, as illustrated in FIG. 1(b), there arises such a problem that an opening area of ventilators 162 is narrowed, and a desired cooling performance is not obtained. In the embodiment of the present invention, as illustrated in FIG. 1(c), the problems of the electric power loss and the heat generation of the feed bus bar 160 can be solved by a structure in which pinnate projections 163 are provided on the feed bus bar 160, and the cooling air is applied to the feed bus bar 160. Further, sufficient opening areas of the ventilators 151 of the backplane 150 and the ventilators 162 of the feed bus bar 160 can be obtained, and the cooling performance of the device can be improved.

Further, the feed bus bar 160 is brought into close contact with an overall surface of the backplane 150, and electrically and mechanically connected thereto at multiple points, thereby being capable of suppressing the stiffness deterioration with the provision of the ventilators 151 in the backplane 150. The feed bus bar 160 is provided with power connector connection ports 164 for connection of the front power units 130 to the backplane 150 from the rear surface of the device.

Also, the shape of the projections provided on the feed bus bar 160 is not limited to the pinnate projections 163, but may be, for example, a shape of frog-like projections or accordion projections. Further, the feed bus bar 160 can be structured to be coated with an insulating material other than portions electrically connected with the backplane 150 for the purpose of preventing short-circuiting.

As described above, the feed bus bar is connected to the backplane 150 to increase the opening area of the ventilators 162, and to provide the pinnate projections 163, thereby enhancing a heat exhaust property. Also, at the same time, the deterioration of stiffness caused by increasing the opening area of the ventilators 162 is suppressed by reinforcement made by the pinnate projections 163. In this embodiment, the 12 V feed system is assumed, but the same effects can be obtained even in the 48 V feed system or other feed systems. The same is applied to the other embodiments.

In the application of the 12 V feed system, a potential difference between a potential to be applied to the feed bus bar 160 and a ground potential becomes equal to or larger than 4.5 V, and equal to or smaller than 16 V.

In the application of the 48 V feed system, the potential difference between the potential to be applied to the feed bus bar 160 and the ground potential becomes equal to or larger than 36 V, and equal to or smaller than 75 V.

Second Embodiment

FIG. 2(a) illustrates a perspective view of a front surface side of the electronic device 200. The electronic device 200 includes a plurality of circuit board units 220, a plurality of front power units 230, a plurality of cooling units 240, a backplane 250, and a feed bus bar 260 within a housing 210.

The electronic device 200 of this embodiment is a modified example of the electronic device 100 in the first embodiment. A large difference of the electronic device 200 from the electronic device 100 of the first embodiment resides in a structure where the front power units 230 are implemented on right and left of a rear surface of the device in a vertical state to ensure a passage of the cooling air.

With this configuration, as compared with the electronic device 100 of the first embodiment, because a direction of the cooling air is linear, the cooling performance of the device can be improved. The other structures are identical with those in the electronic device 100 of the first embodiment. The numbers of mounted circuit board units 220, front power units 230, and cooling units 240 in this embodiment are not limited to the numbers of mounted units in this figure.

Figure 2B:
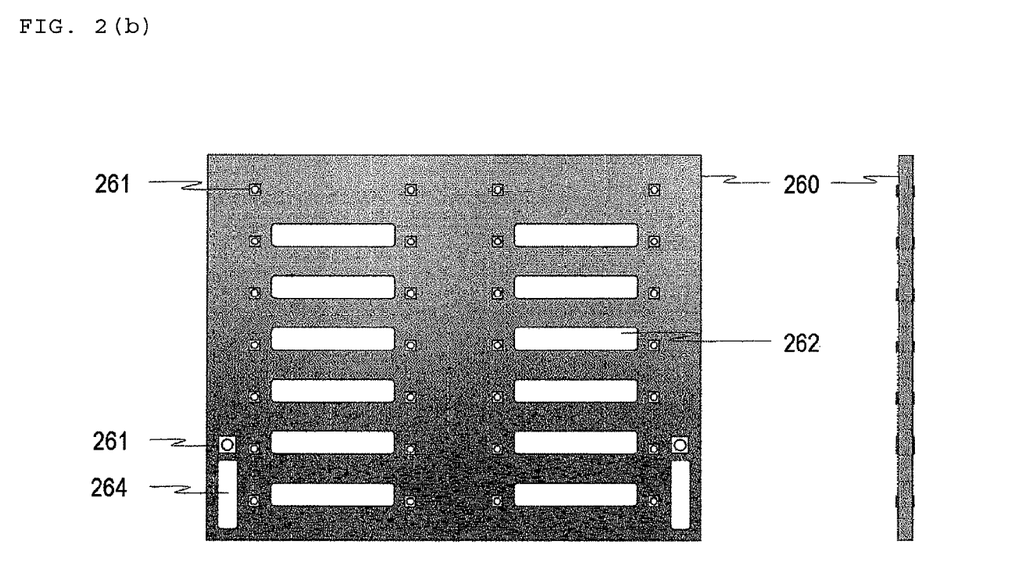
FIG. 2(b) illustrates an example of a feed bus bar in the second embodiment.
Figure 2C:
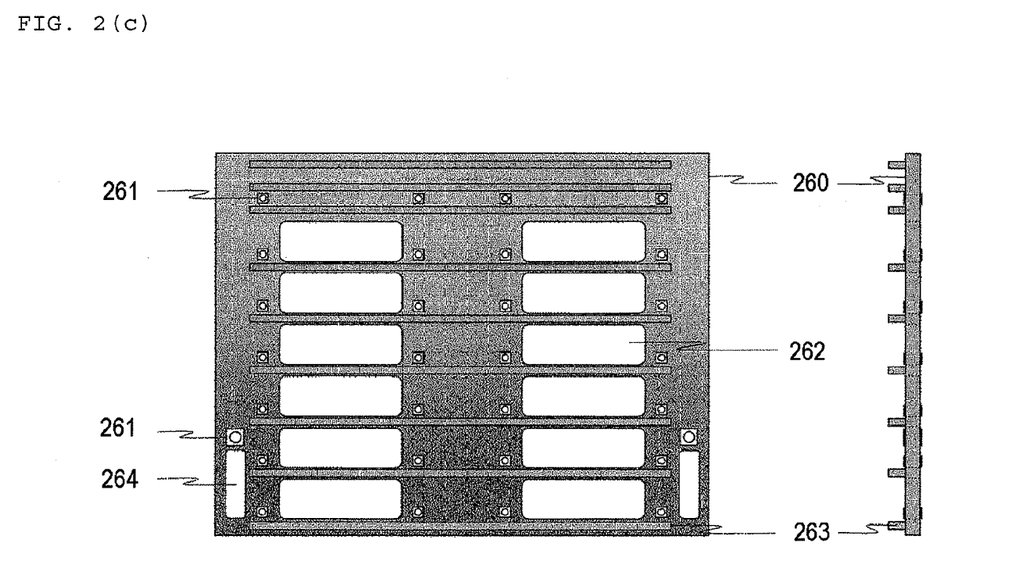
FIG. 2(c) illustrates an example of the feed bus bar in the second embodiment.

FIGS. 2(b) and 2(c) illustrate the feed bus bar 260. A large difference of the feed bus bar 260 in this embodiment from the feed bus bar 160 of the first embodiment resides in that with the structure where the front power units 230 are implemented on right and left of the rear surface of the device in a vertical state to ensure the passage of the cooling air, power connector connection ports 264 are arranged on right and left.

In the configuration of FIG. 2(b), unlike the first embodiment, the passage of the cooling air is ensured in the front power units 230 without provision of the heat exhaust projections to realize an improvement in the cooling performance and the suppression of the stiffness deterioration.

In the configuration of FIG. 2(c), further, ventilators of the feed bus bar 260 are enlarged, and heat exhaust projections are provided to enhance the cooling performance higher than the configuration of FIG. 2(b). At the same time, the projections suppress the stiffness deterioration of the backplane 250 and the feed bus bar 260. The other structures and effects are identical with those in the electronic device 100 of the first embodiment.

Third Embodiment

FIG. 3(a) illustrates a perspective view of a front surface side of the electronic device 300. The electronic device 300 includes a plurality of circuit board units 320, a plurality of front power units 330, a plurality of cooling units 340, a backplane 350, and a feed bus bar 360 within a housing 310.

A large difference of the electronic device 300 from the electronic device 100 of the first embodiment and the electronic device 200 of the second embodiment resides in a structure where the circuit board units 320 are implemented in a horizontal state from a front surface of the device, and implemented in a vertical state in the center of a rear surface of the device.

The circuit board units 320 implemented on the rear surface of the device are, for example, circuit board units having a function of a cross bar switch. The cross bar switch is a circuit board unit having a function of switching a packet arrived from the circuit board units 320 implemented from the front surface of the device to a desired port.

With the structure in which the cross bar switch is implemented on the rear surface of the device, because a signal line length can be shortened, the processing speed and performance of the device can be enhanced. Also, a part of the circuit board units 320 is implemented on the rear surface of the device, resulting in a structure where the front power units 330 are implemented in the vertical state on right and left of the rear surface of the device to ensure the passage of the cooling air.

The other structures are identical with those in the electronic device 100 of the first embodiment and the electronic device 200 of the second embodiment. The numbers of mounted circuit board units 320, front power units 330, and cooling units 340 in this embodiment are not limited to the numbers of mounted units in this figure.

Figure 3B:
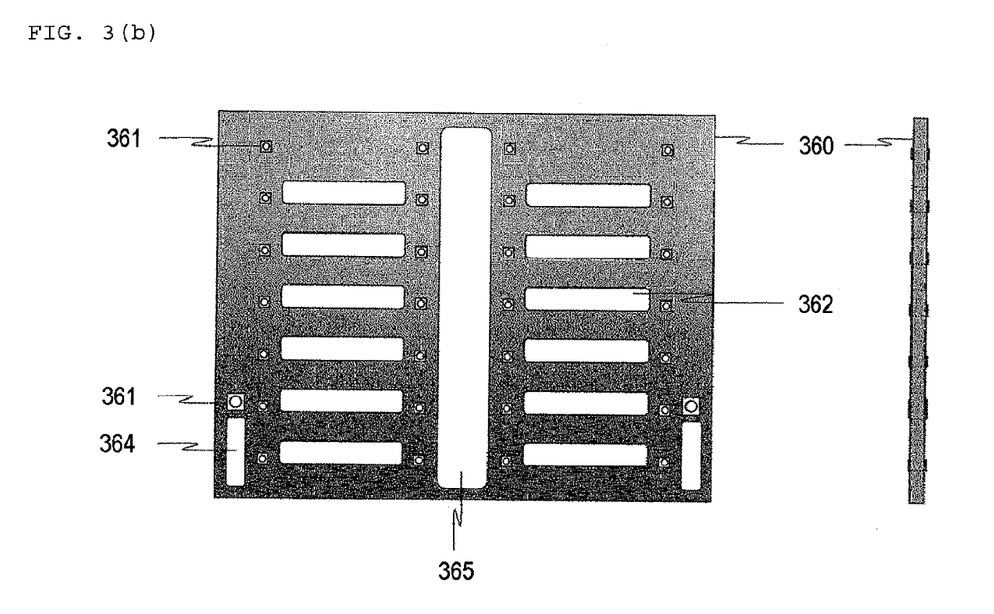
FIG. 3(b) illustrates an example of a feed bus bar in the third embodiment.
Figure 3C:
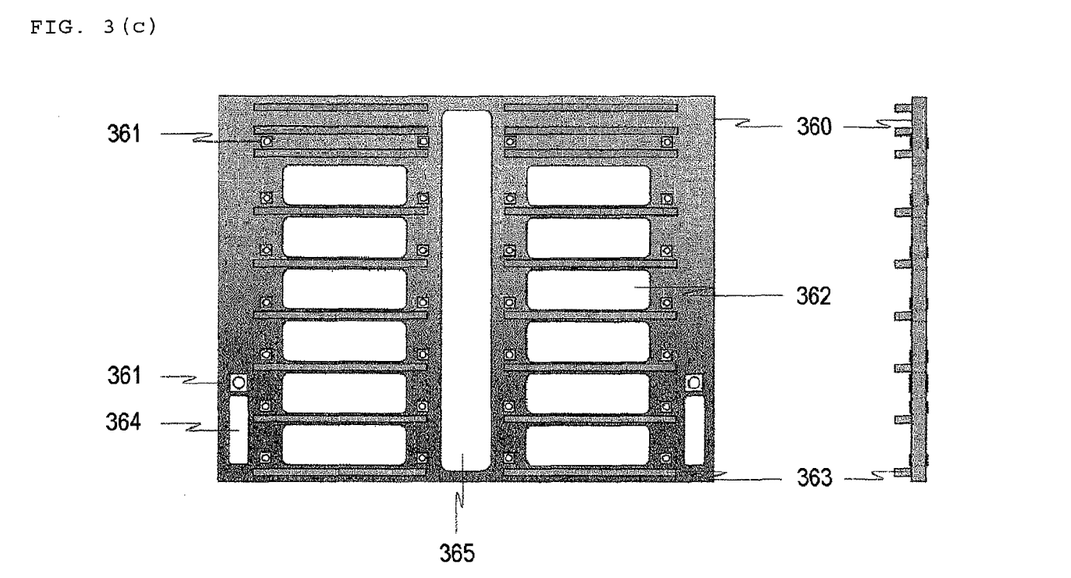
FIG. 3(c) illustrates an example of the feed bus bar in the third embodiment.

FIGS. 3(b) and 3(c) illustrate the feed bus bar 360. The feed bus bar 360 is made of metal such as copper or aluminum, and electrically and mechanically connected to power layers or ground layers of the backplane 350 with the use of feed terminals 361 by screwing or soldering. In this embodiment, the plurality of circuit board units 320 and the plurality of front power units 330 are connected to each other at multiple points by the plurality of feed terminals 361.

In general, the power feeding to the circuit board units 320 is frequently executed by the power layers and the ground layers laid on the backplane 350 configured by a multilayer circuit boards. However, when the amount of current to be supplied is large, even if the numbers of power layers and ground layers are increased, a power loss cannot be ignored, and an increase in the costs is induced. As a result, the feed bus bar 360 is frequently laid to feed a power.

However, even if the feed bus bar 360 is laid to reduce the electric power loss, the heat generation remains as the problem. As a countermeasure against that problem, it is conceivable that a volume of the feed bus bar 360 is increased to reduce an electric resistance value. However, as illustrated in FIG. 3(b), there arises such a problem that an opening area of ventilators 362 is narrowed, and a desired cooling performance is not obtained. For that reason, in this embodiment, the front power units 330 are implemented in the vertical state on right and left of the rear surface of the device to ensure the passage of the cooling air, to thereby improve the cooling performance.

In the embodiment of the present invention, as illustrated in FIG. 3(c), the problems of the electric power loss and the heat generation of the feed bus bar 360 can be solved by a structure in which pinnate projections 363 are provided on the feed bus bar 360, and the cooling air is applied to the feed bus bar 360. Further, sufficient opening areas of ventilators 351 of the backplane 350 and the ventilators 362 of the feed bus bar 360 can be obtained, and the cooling performance of the device can be further improved.

Further, the feed bus bar 360 is brought into close contact with an overall surface of the backplane 350, and electrically and mechanically connected thereto at multiple points, thereby being capable of suppressing the stiffness deterioration with the provision of the ventilators 351 in the backplane 350.

The feed bus bar 360 is provided with power connector connection ports 364 and a backplane connector connection port 365 for connection of the front power units 330 and the circuit board units 320 to the backplane 150 from the rear surface of the device. Also, the shape of the projections provided on the feed bus bar 360 is not limited to the pinnate projections 363, but may be, for example, a shape of frog-like projections or accordion projections. Further, the feed bus bar 360 can be structured to be coated with an insulating material other than portions electrically connected with the backplane 350 for the purpose of preventing short-circuiting.

Fourth Embodiment

FIG. 4(a) illustrates a perspective view of a front surface side of the electronic device 400. The electronic device 400 includes a plurality of circuit board units 420, a plurality of front power units 430, a plurality of cooling units 440, a backplane 450, and a feed bus bar 460 within a housing 410.

The electronic device 400 of this embodiment is a modified example of the electronic device 300 in the third embodiment. A large difference of the electronic device 400 from the electronic device 300 of the third embodiment resides in a structure where the circuit board units 420 are implemented in the vertical state on right and left of a rear surface of the device to ensure a passage of the cooling air. With this configuration, as compared with the electronic device 300 of the third embodiment, because the cooling air is not hindered, the cooling performance of the device can be further improved.

The other structures are identical with those in the electronic device 300 of the third embodiment. The numbers of mounted circuit board units 420, front power units 430, and cooling units 440 in this embodiment are not limited to the numbers of mounted units in this figure.

Figure 4B:
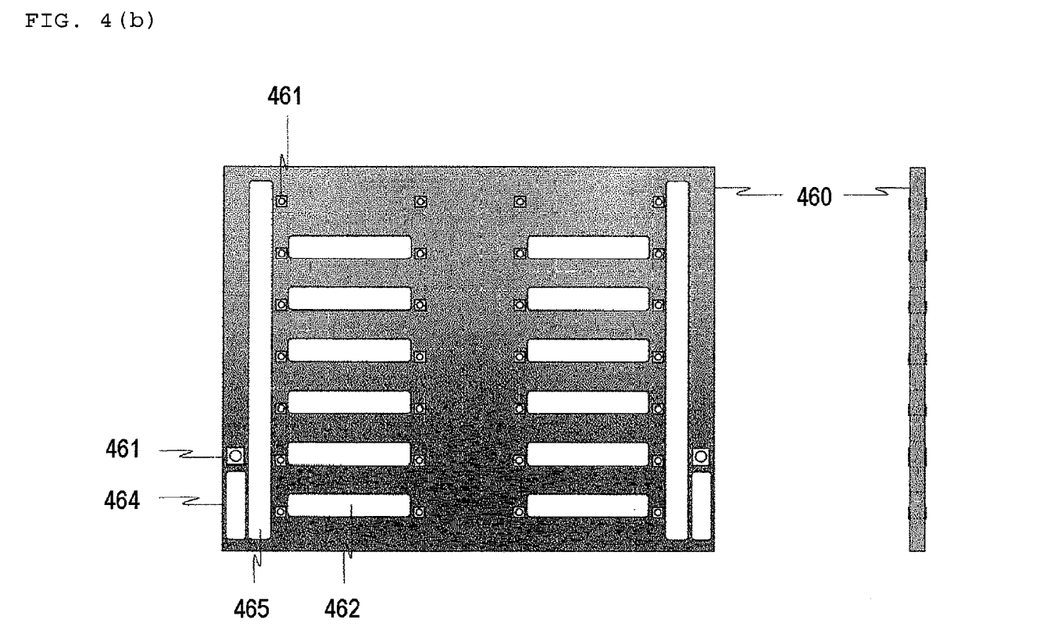
FIG. 4(b) illustrates an example of a feed bus bar in the fourth embodiment.
Figure 4C:
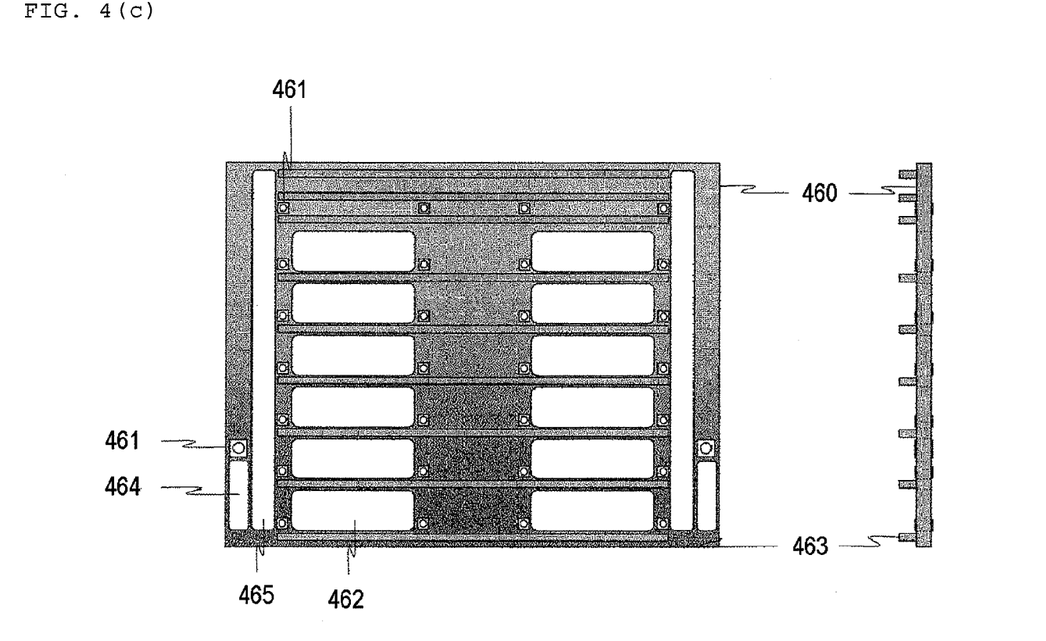
FIG. 4(c) illustrates an example of the feed bus bar in the fourth embodiment.

FIGS. 4(b) and 4(c) illustrate the feed bus bar 460. A large difference of the feed bus bar 460 in this embodiment from the feed bus bar 360 of the third embodiment resides in that with the structure where the circuit board units 420 are implemented on right and left of the rear surface of the device in the vertical state to more ensure the passage of the cooling air, backplane connector connection ports 465 are arranged on right and left. The other structures and effects are identical with those in the electronic device 300 of the third embodiment.

As described above, the electronic device 100 of the first embodiment and the electronic device 200 of the second embodiment are of the anteroposterior intake and exhaust structure in which the circuit board units are implemented in the horizontal state from the front surface of the device, and a flow of the cooling air is sucked from the ventilators in the front surface of the device, passes through the ventilators of the backplane and the ventilators of the feed bus bar, and is exhausted to the rear surface of the device. The electronic device 100 and the electronic device 200 are also of a structure in which the pinnate projections are provided on the feed bus bar, and the cooling air is applied to the feed bus bar, to thereby solve the problems of the electric power loss and the heat generation of the feed bus bar. Further, the sufficient opening areas of the ventilators of the backplane and the ventilators of the feed bus bar can be obtained, and the cooling performance of the device can be improved.

Further, the feed bus bar is brought into close contact with the overall surface of the backplane, and electrically and mechanically connected thereto at multiple points, thereby being capable of suppressing the stiffness deterioration with the provision of the ventilators in the backplane. Further, because the numbers of power layers and ground layers laid on the backplane can be reduced, the costs can be reduced.

The electronic device 300 of the third embodiment and the electronic device 400 of the fourth embodiment are structured so that the circuit board units are implemented in the horizontal state from the front surface of the device, and also implemented in the vertical state from the rear surface of the device. Also, the electronic device 300 and the electronic device 400 are of the anteroposterior intake and exhaust structure in which a flow of the cooling air is sucked from the ventilators in the front surface of the device, passes through the ventilators of the backplane and the ventilators of the feed bus bar, and is exhausted to the rear surface of the device. Further, the electronic device 300 and the electronic device 400 are of a structure in which the pinnate projections are provided on the feed bus bar, and the cooling air is applied to the feed bus bar, thereby being capable of solving the problems of the electric power loss and the heat generation of the feed bus bar.

Further, the sufficient opening areas of the ventilators of the backplane and the ventilators of the feed bus bar can be obtained, and the cooling performance of the device can be improved. Further, the feed bus bar is brought into close contact with the overall surface of the backplane, and electrically and mechanically connected thereto at multiple points, thereby being capable of suppressing the stiffness deterioration with the provision of the ventilators in the backplane. Further, because the numbers of power layers and ground layers laid on the backplane can be reduced, the costs can be reduced.

The present invention is not limited to the above examples and the above embodiments, but can be implemented in various configurations without departing from the spirit of the present invention, and for example, can be modified as follows.

The first embodiment to the fourth embodiment employ the system in which the cooling air is sucked from the ventilators in the front surface of the device, passes through the ventilators of the backplane and the ventilators of the feed bus bar, and is exhausted to the rear surface of the device. Alternatively, the present invention can be applied to a system in which with the use of a push type cooling unit, the cooling air is blown from the rear surface of the device, and exhausted to the front surface of the device.

Also, in the first embodiment to the fourth embodiment, the pinnate projections are provided on the feed bus bar per se. Alternatively, the present invention can employ a structure that solves the problem of the heat generation by fitting a different cooling fin to the feed bus bar.

Further, the first embodiment to the fourth embodiment assume the network communication device. Also, the present invention can be applied to an information processing device such as a server without departing from the spirit of the present invention.

REFERENCE SIGNS LIST

100 electronic device
110 housing
120 circuit board unit
121 ventilator
122 backplane connector
130 front power unit
131 power connector
140 cooling unit
150 backplane
151 ventilator
160 feed bus bar
161 feed terminal
162 ventilator
163 pinnate projection
164 power connector connection port
200 electronic device
210 housing
220 circuit board unit
221 ventilator
222 backplane connector
230 front power unit
231 power connector
240 cooling unit
250 backplane
251 ventilator
260 feed bus bar
261 feed terminal
262 ventilator
263 pinnate projection
264 power connector connection port
300 electronic device
310 housing
320 circuit board unit
321 ventilator
322 backplane connector
330 front power unit
331 power connector
340 cooling unit
350 backplane
351 ventilator
360 feed bus bar
361 feed terminal
362 ventilator
363 pinnate projection
364 power connector connection port
365 backplane connector connection port
400 electronic device
410 housing
420 circuit board unit
421 ventilator
422 backplane connector
430 front power unit
431 power connector
440 cooling unit
450 backplane
451 ventilator 460 feed bus bar
461 feed terminal
462 ventilator
463 pinnate projection
464 power connector connection port
465 backplane connector connection port

The invention claimed is:

1. An electronic device, comprising:
 a circuit board unit;
 a backplane that connects the circuit board to a front surface thereof;
 a feed bus bar that is electrically connected to a back surface of the backplane and electrically connected to a power unit;
 wherein a ventilator is formed in the backplane and the feed bus bar, and
 wherein a radiation projection is disposed on the bus bar.

2. The electronic device according to claim 1, further comprising:
 a cooling fan provided on a back surface side of the backplane,
 wherein the power unit includes two units of a first power unit and a second power unit, the first power unit and the second power unit are arranged between the backplane and the cooling fan, and the first power unit and the second power unit are arranged separately from each other.

3. The electronic device according to claim 2,
 wherein the power unit is arranged separately to right and left.

4. The electronic device according to claim 2, further comprising:
 a back circuit board unit that is connected to the back surface of the backplane.

5. The electronic device according to claim 3, further comprising:
 one or more back circuit board units that are connected to the back surface of the backplane,
 wherein the back circuit board units are arranged in the vicinity of a center between the first power unit and the second power unit.

6. The electronic device according to claim 3, further comprising:
 a first back circuit board unit and a second back circuit board unit which are connected to the back surface of the backplane,
 wherein the first back circuit board unit is arranged between the first power unit and the second power unit, and in the vicinity of the first power unit, and
 wherein the second back circuit board unit is arranged between the first power unit and the second power unit, and in the vicinity of the second power unit.

7. The electronic device according to claim 3, further comprising:
 one or more back circuit board units that are connected to the back surface of the backplane,
 wherein one of the back circuit board units are arranged in the vicinity of a center between the first power unit and the second power unit,
 wherein another back circuit board unit is arranged between the first power unit and the second power unit, and in the vicinity of the first power unit, and
 wherein still another back circuit board unit is arranged between the first power unit and the second power unit, and in the vicinity of the second power unit.

8. The electronic device according to claim 5,
 wherein the back circuit board units function as a cross bar switch.

9. The electronic device according to claim 1,
 wherein a cooling air is sucked from a front surface side of the backplane, and exhausted to a back surface side thereof.

10. The electronic device according to claim 1,
 wherein a cooling air is blown from a back surface side of the backplane, and exhausted to a front surface side thereof.

11. The electronic device according to claim 1,
 wherein a potential difference between a potential applied to the feed bus bar and a ground potential is equal to or larger than 4.5 V, and equal to or smaller than 16 V.

12. The electronic device according to claim 1,
 wherein a potential difference between a potential applied to the feed bus bar and a ground potential is equal to or larger than 36 V, and equal to or smaller than 75 V.

13. The electronic device according to claim 1,
 wherein the radiation projection has a shape that is pinnate.

* * * * *